(12) United States Patent
Ghyselen

(10) Patent No.: US 11,940,407 B2
(45) Date of Patent: Mar. 26, 2024

(54) MICRO-SENSOR FOR DETECTING CHEMICAL SPECIES AND ASSOCIATED MANUFACTURING METHOD

(71) Applicant: Soitec, Bernin (FR)

(72) Inventor: Bruno Ghyselen, Seyssinet (FR)

(73) Assignee: Soitec, Bernin (FR)

( * ) Notice: Subject to any disclaimer, the term of this patent is extended or adjusted under 35 U.S.C. 154(b) by 783 days.

(21) Appl. No.: 17/044,205

(22) PCT Filed: Mar. 19, 2019

(86) PCT No.: PCT/FR2019/050610
§ 371 (c)(1),
(2) Date: Sep. 30, 2020

(87) PCT Pub. No.: WO2019/186027
PCT Pub. Date: Oct. 3, 2019

(65) Prior Publication Data
US 2021/0132002 A1  May 6, 2021

(30) Foreign Application Priority Data

Mar. 30, 2018 (FR) ........................ 1852783

(51) Int. Cl.
*G01N 27/414* (2006.01)
*B01L 3/00* (2006.01)
(Continued)

(52) U.S. Cl.
CPC .... *G01N 27/4148* (2013.01); *B01L 3/502715* (2013.01); *H01L 21/30604* (2013.01);
(Continued)

(58) Field of Classification Search
CPC ........... G01N 27/4148; B01L 3/502715; B01L 2200/12; H01L 21/30604; H01L 21/76254;
(Continued)

(56) References Cited

U.S. PATENT DOCUMENTS 8,241,998 B2 * 8/2012 Cayrefourcq ..... H01L 21/76254
438/455
9,679,897 B1 * 6/2017 Cao ................. H01L 21/823431
(Continued)

FOREIGN PATENT DOCUMENTS

EP 0893827 A1 1/1999
TW 201013179 A 4/2010
(Continued)

OTHER PUBLICATIONS

Chinese First Office Action For Application No. 201980023245.7 dated Sep. 22, 2022, 11 pages.
(Continued)

*Primary Examiner* — Shaun M Campbell
(74) *Attorney, Agent, or Firm* — TraskBritt

(57) ABSTRACT

A microsensor for detecting ions in a fluid, comprises: a field-effect transistor having a source, a drain, an active region between the source and the drain, and a gate disposed above the active region, an active layer, in which the active region is formed, a dielectric layer positioned beneath the active layer, a support substrate disposed under the dielectric layer and comprising at least one buried cavity located plumb with the gate of the field-effect transistor in order to receive the fluid.

17 Claims, 4 Drawing Sheets

(51) Int. Cl.
  *H01L 21/306* (2006.01)
  *H01L 21/762* (2006.01)
  *H01L 29/16* (2006.01)
  *H01L 29/161* (2006.01)
  *H01L 29/20* (2006.01)

(52) U.S. Cl.
  CPC ..... *H01L 21/76254* (2013.01); *B01L 2200/12* (2013.01); *H01L 29/16* (2013.01); *H01L 29/161* (2013.01); *H01L 29/20* (2013.01); *H01L 29/2003* (2013.01)

(58) Field of Classification Search
  CPC ....... H01L 29/16; H01L 29/161; H01L 29/20; H01L 29/2003
  See application file for complete search history.

(56) References Cited

U.S. PATENT DOCUMENTS

| | | |
|---|---|---|
| 2005/0212016 A1 | 9/2005 | Brunner et al. |
| 2011/0227043 A1 | 9/2011 | Guo et al. |
| 2014/0106494 A1* | 4/2014 | Bedell .................. H01L 21/84 257/E21.409 |
| 2015/0014752 A1 | 1/2015 | D'Emic et al. |
| 2016/0187288 A1* | 6/2016 | Cheng ................ G01N 27/4145 257/253 |
| 2018/0097076 A1* | 4/2018 | Cheng ............... H01L 21/76895 |
| 2018/0238827 A1* | 8/2018 | Cheng ................ G01N 27/4145 |

FOREIGN PATENT DOCUMENTS

| | | |
|---|---|---|
| TW | 201435340 A | 9/2014 |
| WO | 00/51136 A1 | 8/2000 |
| WO | 00/51180 A1 | 8/2000 |

OTHER PUBLICATIONS

Chinese 2nd Office Action for Application No. 201980023245.7 dated Feb. 3, 2023, 6 pages.
Taiwan Office Action for Application No. 11120691010 dated Jul. 13, 2022.
International Search Report for International Application No. PCT/FR2019/050610 dated Jun. 13, 2019, 3 pages.
International Written Opinion for International Application No. PCT/FR2019/050610 dated Jun. 13, 2019, 6 pages.
Chen et al., Fabrication of a Graphene Field Effect Transistor Array on Microchannels for Ethanol Sensing, Applied Surface Science, vol. 258, Issue 6, (Jan. 1, 2012), pp. 1971-1975.
French Search Report for Application No. 1852783 dated Aug. 9, 2018, 2 pages.

* cited by examiner

MICRO-SENSOR FOR DETECTING CHEMICAL SPECIES AND ASSOCIATED MANUFACTURING METHOD

CROSS-REFERENCE TO RELATED APPLICATIONS

This application is a national phase entry under 35 U.S.C. § 371 of International Patent Application PCT/FR2019/050610, filed Mar. 19, 2019, designating the United States of America and published in French as International Patent Publication WO 2019/186027 A1 on Oct. 3, 2019, which claims the benefit under Article 8 of the Patent Cooperation Treaty to French Patent Application Serial No. 1852783, filed Mar. 30, 2018.

TECHNICAL FIELD

The present disclosure relates to the field of microsensors for detecting chemical species in ionic form that are present in a fluid. It relates, in particular, to a microsensor comprising an ion-sensitive field-effect transistor and comprising integrated microfluidic channels for transporting the fluid.

BACKGROUND

Field-effect transistors (FET) initially devoted to the field of the electronics of circuits have rapidly been extended to new application areas in the field of chemical analysis. Ion-sensitive field-effect transistors (ISFETs) are, in particular, known. In the microsensors based on ISFETs, the gate of the transistor is placed in contact with the chemical solution to be analyzed; the chemical species present in the solution modify the electrochemical potential in the vicinity of the gate, and may thus influence the current circulating between the drain and the source of the transistor. The conduction characteristics of the ISFET are therefore capable of changing as a function of the concentration of the ions in contact with the gate.

In general, in a microsensor based on an ISFET transistor, the conventional approach involves bringing the chemical solution into contact with the gate of the transistor (or with the gate oxide), at the front face of the transistor, i.e., in the active region of the component, where sensitive elements of the transistor are formed (source electrode, drain electrode, metal contacts, etc.) Even though local encapsulation layers are used to insulate these elements from the chemical solution, infiltrations may be the cause of premature wear or failure of the transistor. Moreover, the formation of such encapsulation layers further complicates the production process.

Alternatively, document WO 00/51180 proposes the formation of an ISFET on an SOI (silicon on insulator) substrate, then the formation of an insulating support layer on the front face of the transistor and finally the partial or complete removal of the silicon substrate to expose the oxide layer of the SOI; the oxide layer is then placed in contact with the chemical solution. This approach avoids bringing the front face of the transistor into contact with a chemical solution and therefore prevents risks of infiltration. However, it has the drawback of carrying out a step of removing, by etching, several hundreds of microns of the silicon substrate. This removal may be aggressive for the active layer (silicon surface layer of the SOI) and the sensitive elements of the transistor.

In the case of a partial etching of the silicon substrate, solely plumb with the gate, another difficulty arises from the required alignment between the front face and the rear face of the SOI substrate.

In the case of complete etching of the silicon substrate, it is necessary to form channels for transporting and confining the solution plumb with the gate, which may also pose problems of alignment.

BRIEF SUMMARY

The present disclosure aims to overcome all or some of the aforementioned drawbacks, and relates to a microsensor for chemical analysis, based on a field-effect transistor, and to the associated fabrication process.

The present disclosure relates to a microsensor for detecting ions in a fluid, comprising:
- a field-effect transistor having a source, a drain, an active region between the source and the drain, and a gate positioned above the active region,
- an active layer in which the active region is formed,
- a dielectric layer positioned beneath the active layer, and
- a support substrate, positioned beneath the dielectric layer and comprising at least one buried cavity, located plumb with the gate of the transistor, to receive the fluid.

According to other advantageous and non-limiting features of the disclosure, which may be implemented alone or in any technically feasible combination:
- the buried cavity is connected to a network of buried channels formed in the support substrate, for transporting the fluid;
- the active layer has a thickness between a few nanometers and a few hundreds of nanometers;
- the dielectric layer has a thickness between a few angstroms and a few tens of nanometers;
- the active layer is formed of at least one semiconductor material selected from silicon, silicon-germanium, germanium, III-V compounds (arsenides, phosphides, nitrides);
- the dielectric layer is formed of at least one insulating material selected from silicon dioxide, silicon nitride, an oxynitride, hafnium oxide ($HfO_2$), alumina ($Al_2O_3$), tantalum oxide ($Ta_2O_5$) or a stack of layers of these materials;
- the active layer is made of silicon and the transistor is produced according to an FDSOI architecture;
- the cavity has lateral dimensions of between around 100 nanometers and a few tens of microns and a depth of between a few tens of nanometers and a few hundreds of microns;
- the cavity comprises a constriction in the vicinity of the dielectric layer and a flared portion in a deeper zone of the support substrate.

The present disclosure also relates to a process for fabricating a microsensor for detecting ions in a fluid, comprising:
- providing a structure comprising an active layer, positioned on a dielectric layer, itself positioned on a support substrate; the structure comprising at least one buried cavity, formed in the support substrate and positioned beneath the dielectric layer;
- producing a field-effect transistor having a source, a drain, an active region formed in the active layer and extending between the source and the drain, and a gate positioned above the active region, plumb with the cavity.

According to other advantageous and non-limiting features of the present disclosure, which may be implemented alone or in any technically feasible combination:

the provision of the structure comprises:
forming, on a first face of the support substrate, at least one cavity, by etching,
joining the first face of the support substrate to a first face of a donor substrate comprising the dielectric layer,
thinning the donor substrate, so as to form the active layer.

the thinning of the donor substrate comprises:
prior to joining, implanting light species in the donor substrate, at the first face thereof, in order to form a fragile buried layer;
after joining, separating at the fragile buried layer, in order to form on the one hand the structure comprising the active layer positioned on the dielectric layer, itself positioned on the support substrate, and on the other hand a residual donor substrate.

BRIEF DESCRIPTION OF THE DRAWINGS

Other features and advantages of the present disclosure will become apparent from the following detailed description, with reference to the accompanying figures, in which.

DETAILED DESCRIPTION

In the description, the same references in the figures might be used for elements of the same type. The figures are schematic representations which, for the sake of legibility, are not to scale. In particular, the thicknesses of the layers along the z-axis are not to scale with respect to their lateral dimensions along the x- and y-axes; and the relative thicknesses of the layers with respect to one another are not necessarily respected in the figures.

Figure 1A:
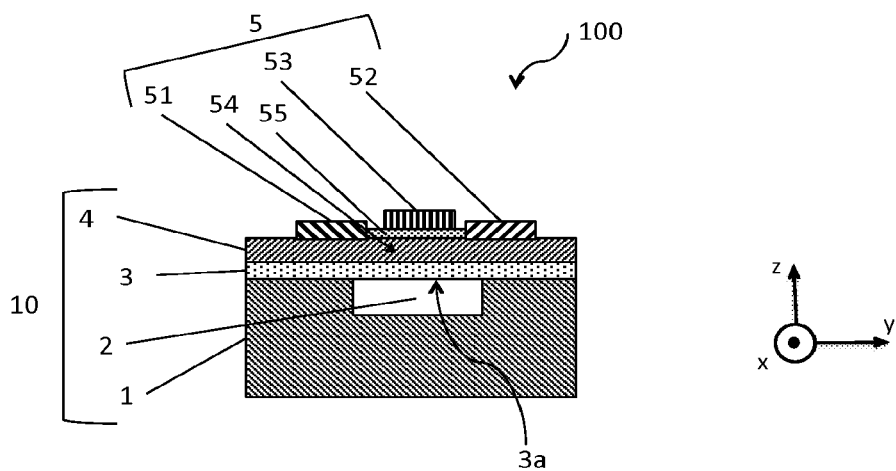
FIGS. 1a and 1b present microsensors in accordance with the present disclosure.

The present disclosure relates to a microsensor 100 for detecting ions in a fluid. The microsensor 100 comprises a structure 10 comprising an active layer 4, positioned on a dielectric layer 3, itself positioned on a support substrate 1 (FIG. 1a). The active layer 4 is intended to contain and/or support at least one microelectronic component, in particular, a field-effect transistor (FET). Furthermore, the active layer 4 may be based on a single material or may include several layers of different materials.

Advantageously, the active layer 4 is formed of at least one semiconductor material selected from silicon, silicon-germanium, germanium, III-V compounds (arsenides, phosphides, nitrides, etc.) And it has a thickness between a few nanometers and a few hundreds of nanometers.

The support substrate 1 may be based on a semiconductor or an insulating material, such as silicon, germanium, silicon carbide, gallium arsenide, indium phosphide, sapphire or glass. Preferably, the support substrate 1 is formed of silicon.

The structure 10 further comprises at least one buried cavity 2, formed in the support substrate 1 and positioned beneath the dielectric layer 3. A portion of the surface 3a of the dielectric layer 3 adjacent the buried cavity 2 is, therefore, free.

The microsensor 100 also comprises a field-effect transistor 5 (also referred to herein as "FET 5") formed in and on the active layer 4 of the structure 10. It has a source 51, a drain 52, an active region 54 between the source 51 and the drain 52, and a gate 53 positioned above the active region 54. The active region 54 is formed in the active layer 4, it comprises a conduction channel in which the current is capable of flowing, between the source 51 and the drain 52, when the field-effect transistor 5 is in an on-state. The gate 53 is positioned on the insulating layer 55 (gate oxide), which separates it from the active layer 4.

Preferably, the active layer 4 is thin. For example, it could have a thickness of 15 nm. In case of an active layer 4 made of silicon, the field-effect transistor 5 is advantageously produced according to conventional CMOS technology in and on the active layer 4; it is, for example, of MOSFET type and operates in fully depleted mode. The field-effect transistor 5 is advantageously produced according to FDSOI (fully depleted SOI) architecture.

In the case of an active layer 4 made of III-V material, the field-effect transistor 5 maybe of HEMT (high electron mobility transistor) type.

An FET transistor for the chemical detection of ions must be very sensitive. In particular, the threshold voltage of the transistor must preferably be sensitive to the variation of the electrochemical potential in the vicinity of the gate, to detect as precisely as possible a variation in concentration of ions in the solution brought into contact with the gate.

An FET 5 in "fully depleted" mode of the microsensor 100, produced on an active layer 4, in particular, made of silicon, and a dielectric layer 3, have features perfectly suitable for this application.

According to the disclosure, the gate 53 is produced substantially plum with the buried cavity 2 and all or some of the active region 54 is located above the buried cavity 2.

The buried cavity 2 is intended to receive the fluid to be analyzed and to bring it into contact with the dielectric layer 3. The buried cavity 2 could have lateral dimensions (in the (x, y) plane in the figures) between around 100 nanometers and a few tens of microns and a depth (along the z axis in the figures) between a few tens of nanometers and a few hundreds of microns. By way of example, a buried cavity 2 could have a width (along the y axis in the figures) of around 150 nm, a length (along the x axis in the figures) of around 500 nm and a depth on the order of 150 nm.

Advantageously, the dielectric layer 3 is formed of at least one insulating material selected from silicon dioxide, silicon nitride, an oxynitride, hafnium oxide ($HfO_2$), alumina ($Al_2O_3$), tantalum oxide ($Ta_2O_5$) or a stack of layers of these materials. The dielectric layer 3 has a thickness of between a few angstroms and a few tens of nanometers.

The ions present in the fluid will modify the electrochemical potential at the surface 3a of the dielectric layer 3. The FET 5 then operates with a dual gate: the upper gate 53, which may be biased at a certain potential and the lower chemical gate, the potential of which (at the surface 3a of the dielectric layer 3) is influenced by the presence and the concentration of the ions of the fluid contained in the buried cavity 2.

The insulating material of the dielectric layer 3 is selected as a function of the type of ions to be detected in the fluid.

Figure 1B:
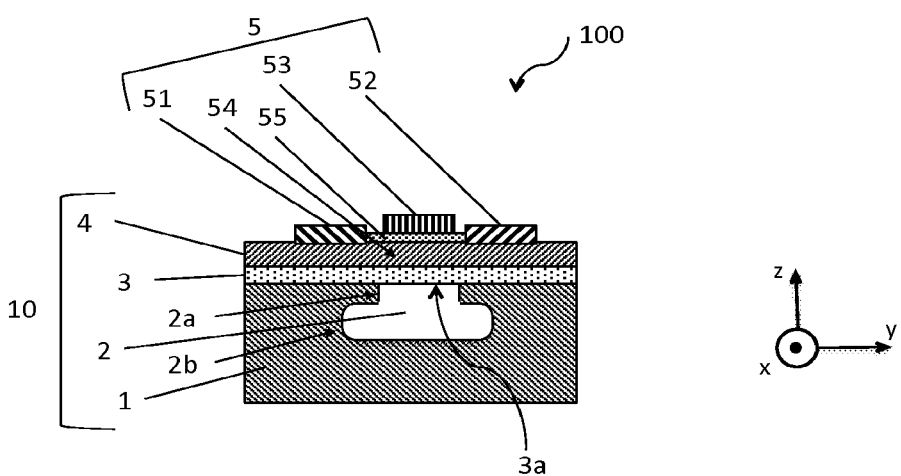

According to one advantageous embodiment, illustrated in FIG. 1b, the buried cavity 2 comprises a constriction 2a in the vicinity of the dielectric layer 3; at this constriction 2a, the cavity 2 has lateral dimensions corresponding substantially to the dimensions of the gate 53. The buried cavity 2 further comprises a flared portion 2b in its deeper zone. This flared portion 2b promotes the circulation of the fluid. It is also noted that the constriction 2a, having reduced lateral dimensions, promotes the mechanical strength of the stack of dielectric and active layers 3, 4 positioned on top of the buried cavity 2 and may simplify the fabrication of the structure 10 and/or of the microsensor 100.

By way of example, a buried cavity 2 according to this embodiment could have, at the constriction 2a, a width (along the y axis) of around 100 nm, a length (along the x axis) of around 200 nm, and at the flared portion 2b, a width (along they axis) of around 1000 nm, a length (along the x axis) of around 2000 nm. It could furthermore have a depth of the order of 500 nm.

Advantageously, the (at least one) buried cavity 2 is connected to a network of buried channels 20 formed in the support substrate 1, in order to continuously or periodically transport the fluid. The network comprises a fluid inlet 21 and a fluid outlet 22 (FIG. 2e). An external pumping system makes it possible to circulate the fluid in the network of buried channels 20, in order to convey it into the buried cavity 2. After the measurement, the fluid is removed from the buried cavity 2 by pumping or flushed from the buried cavity 2 by injecting a rinsing solution into the network of buried channels 20.

The present disclosure also relates to a process for fabricating the microsensor 100 for detecting ions in a fluid.

The fabrication process comprises a first step of providing a structure 10 comprising an active layer 4, positioned on a dielectric layer 3, itself positioned on a support substrate 1. The structure 10 comprises at least one buried cavity 2, formed in the support substrate 1 and positioned beneath the dielectric layer 3.

Figure 2A:
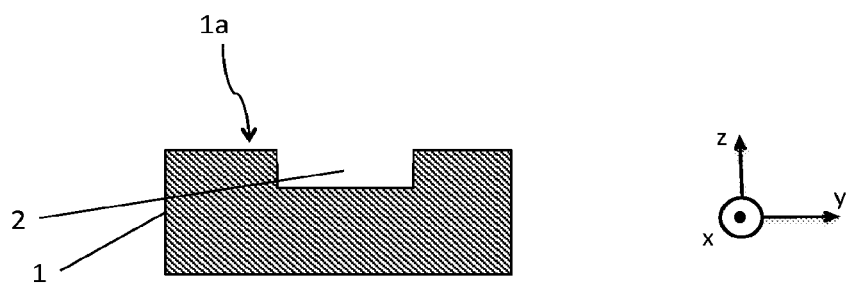
FIGS. 2a to 2e and 3a to 3d present steps of the process for fabricating a microsensor in accordance with the present disclosure.

According to one advantageous embodiment, this first step includes the formation, on a first face 1a of the support substrate 1, of the (at least one) buried cavity 2, by etching (FIG. 2a). As is conventionally done during lithography and etching steps, a masking layer (not represented) is deposited on the first face 1a and removed locally at the locations intended to be etched in order to form the buried cavity (or cavities) 2. The network of buried channels 20 communicating with the buried cavity 2 is preferably produced at the same time.

Figure 3A:
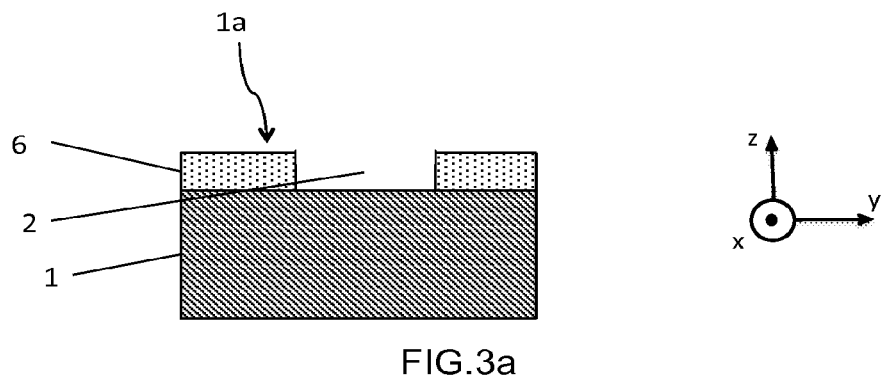
Figure 3A:
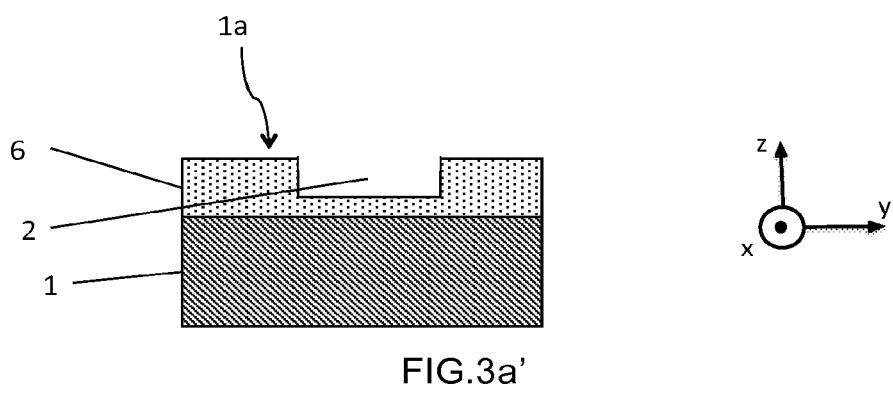

According to variants illustrated in FIGS. 3a and 3a', the support substrate 1 comprises an intermediate layer 6 at the first face 1a thereof. The buried cavity (or cavities) 2 and the network of buried channels 20 are formed in the intermediate layer 6. The intermediate layer 6 is preferably formed of at least one insulating material selected from silicon dioxide, silicon nitride, an oxynitride, hafnium oxide ($HfO_2$), alumina ($Al_2O_3$), tantalum oxide ($Ta_2O_5$) or a stack of layers of these materials.

A buried cavity 2 could have lateral dimensions (in the (x, y) plane in the figures) between around 100 nanometers and a few tens of microns and a depth (along the z axis in the figures) between a few tens of nanometers and a few hundreds of microns. The buried channels 20 could have dimensions in similar ranges.

Figure 2B:
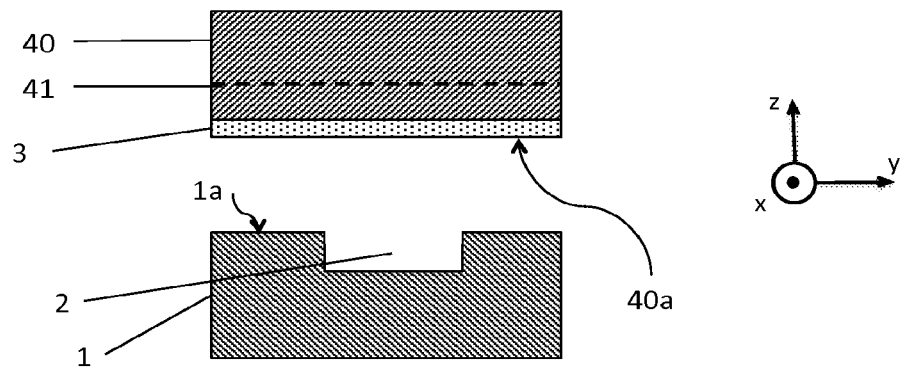
Figure 3B:
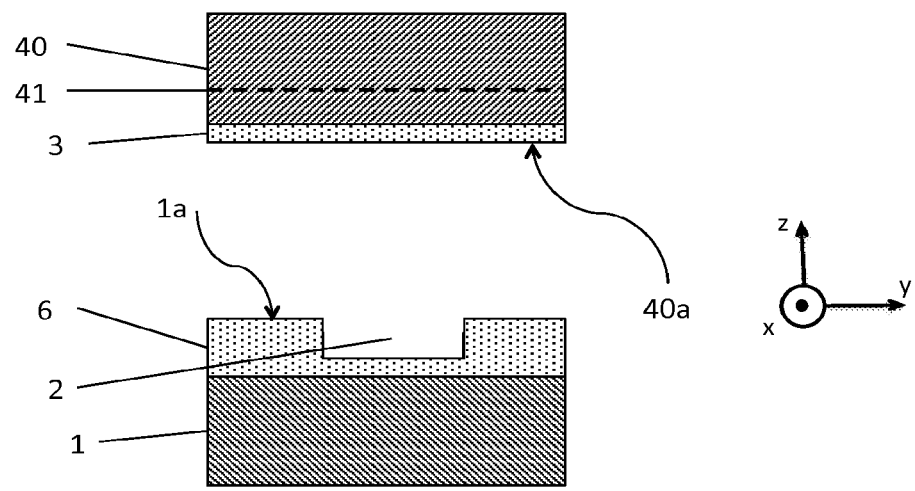

Still according to the advantageous embodiment, the first step of the process comprises the provision of a donor substrate 40, having a first face 40a and comprising a dielectric layer 3 (FIGS. 2b, 3b). The dielectric layer 3 may be produced by thermal growth or by deposition, depending on the nature of the material(s) forming it and depending on the nature of the donor substrate 40. The dielectric layer 3 is preferably formed of at least one insulating material selected from silicon dioxide, silicon nitride, an oxynitride, hafnium oxide ($HfO_2$), alumina ($Al_2O_3$), tantalum oxide ($Ta_2O_5$) or a stack of layers of these materials. The donor substrate 40 is preferably formed of at least one semiconductor material selected from silicon, silicon-germanium, germanium, III-V compounds (arsenides, phosphides, nitrides, etc.).

In order to form the active layer 4 from the donor substrate 40, use will preferably be made of a transfer process especially suitable for thin to very thin layers and that provides a good layer thickness uniformity and a very good crystalline and surface quality.

For example, the SMART CUT® process may be used. Light species (hydrogen and/or helium) are then implanted in the donor substrate 40, at the first face 40a thereof, so as to form a fragile buried layer 41 (FIGS. 2b, 3b).

Figure 2C:
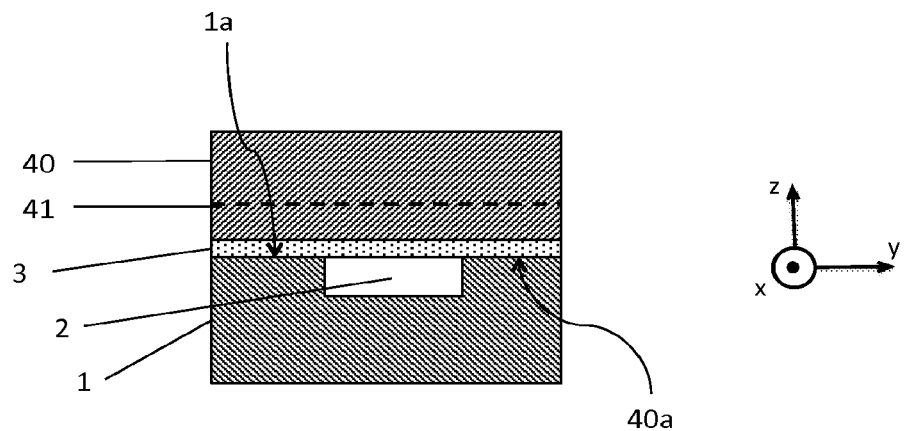
Figure 3C:
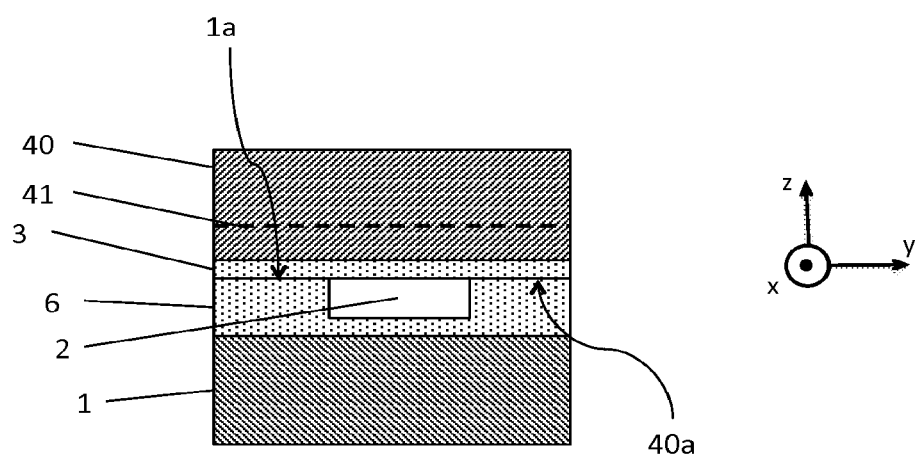

The joining of the first face 1a of the support substrate 1 comprising the buried cavity (or cavities) 2 and the network of buried channels 20, to the first face 40a of a donor substrate 40 comprising a dielectric layer 3 is then carried out (FIGS. 2c, 3c). The buried cavity 2 and the network of buried channels 20 are thus buried in the joined structure.

Advantageously, the joining is carried out by direct bonding, molecular adhesion of the two surfaces brought into contact. The principle of molecular adhesion, which is well known in the prior art, will not be described in further detail here. Note that a very good surface finish (cleanness, low roughness, etc.) of the substrates to be joined is required, in order to obtain a good final quality of the structure 10.

Still according to the advantageous embodiment, the first step of the process comprises the thinning of the donor substrate 40, so as to form the active layer 4.

Figure 2D:
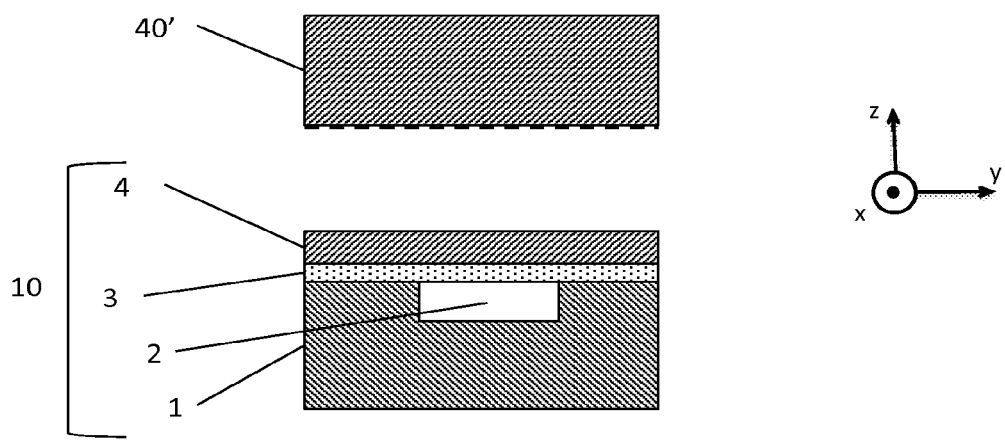
Figure 2E:
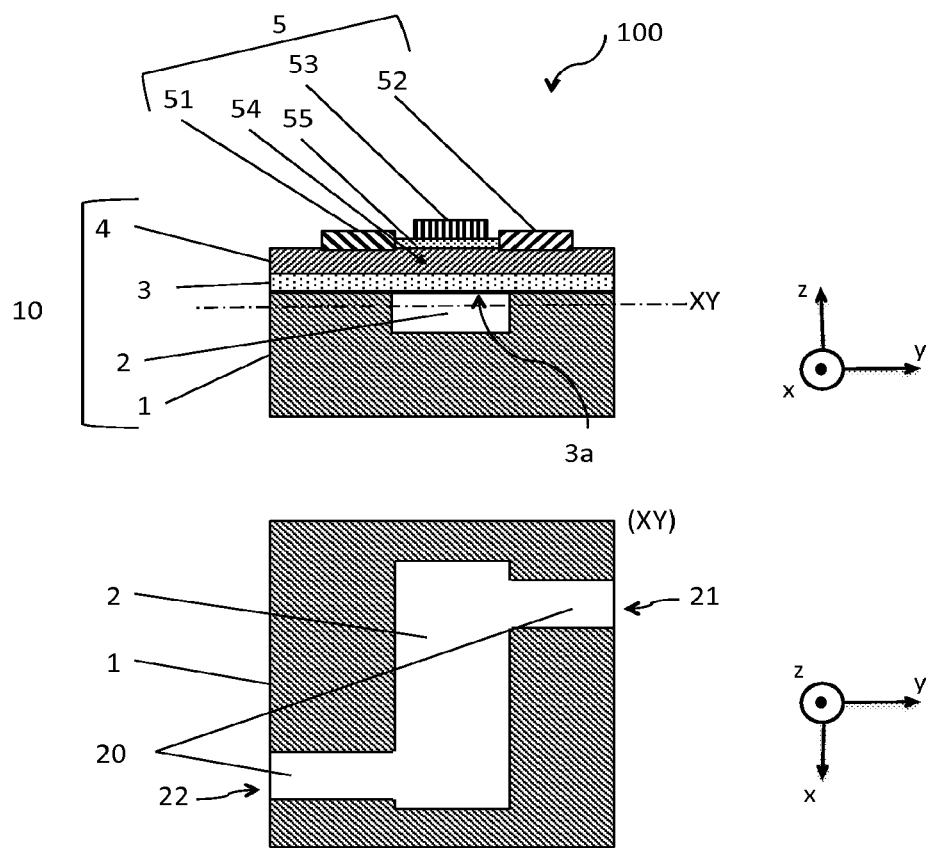
Figure 3D:
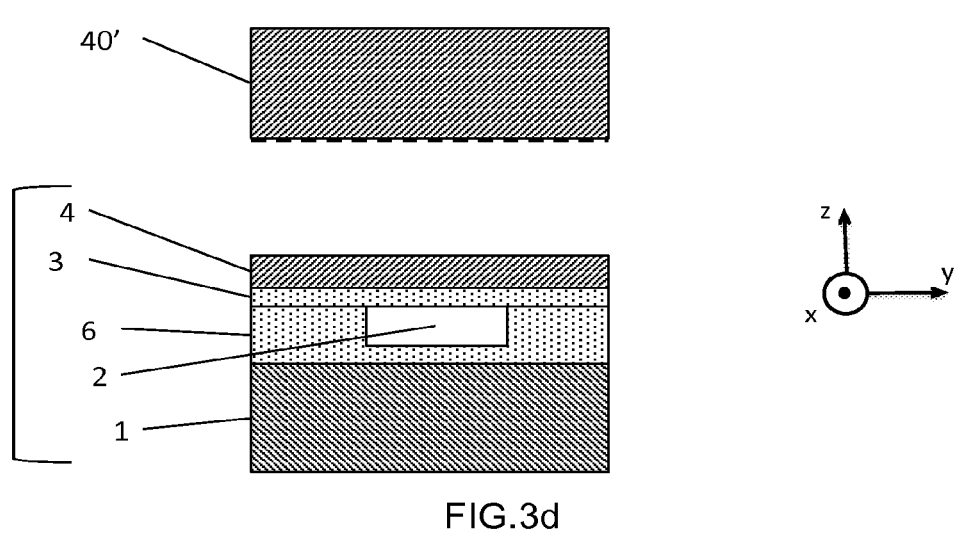

The separation at the fragile buried layer 41 may take place during a heat treatment, for example, between 250° C. and 550° C., and/or under mechanical stress. This separation makes it possible, on the one hand, to form the structure 10 comprising the active layer 4 positioned on the dielectric layer 3, itself positioned on the support substrate 1, and, on the other hand, to form a residual donor substrate 40' (FIGS. 2d, 3d).

Finishing steps (for example, thermal oxidation, thermal smoothing, or others) are applied to the separated surface of the active layer 4, so as to give it the required quality (in terms of thickness, uniformity, crystalline quality, roughness, defectivity) for the subsequent production of the FET transistors.

The fabrication process comprises a second step of producing a field-effect transistor 5 having a source 51, a drain 52, an active region 54 formed in the active layer 4 and extending between the source 51 and the drain 52. The transistor 5 also comprises a gate 53 positioned above the active region 54, plumb with the (at least one) cavity 2 (FIG. 2e). The alignment between the cavity 2 and the gate 53 of the transistor 5 could be easily achieved by using the alignment marks produced during the formation of the cavity 2 and the channels 20 on the support substrate 1.

Conventional methods for producing transistors based on CMOS technology will be able to be used.

Advantageously, each cavity 2 has a dimension, in the (x, y) plane, of less than 1000 nm or even of less than 200 nm, it being possible for the other dimension to range up to a few tens of microns (FIG. 2e). The smallest dimension (width) is along the source 51-drain 52 axis (y axis in the figures). The largest dimension (length) preferably corresponds to the width of the active region 54, i.e., to the size of the source 51, drain 52 and gate 53 electrodes (along the x axis in the figures). Such a configuration of the buried cavity 2 in the (x, y) plane is favorable to the mechanical strength of the stack portions of active layer 4 and dielectric layer 3 that are suspended above the buried cavity 2.

According to a variant of the fabrication process, the cavity (or cavities) 2 and the network of channels 20, produced in the support substrate 1, could be filled by a sacrificial material. The production of the structure 10 and of the transistor 5 of the microsensor 100 is carried out even though the cavities 2 are filled with the material. Finally, after the FET 5 is produced, a step of etching in the active layer 4 and the dielectric layer 3 makes it possible to access the cavity (cavities) 2 and channels 20; the sacrificial material is chemically etched in order to empty the cavity (cavities) 2 and channels 20, an encapsulation layer protecting the sensitive elements on the front face of the transistor 5. The sacrificial material is selected so that it is preferably attacked by the chemical etching, compared to the support substrate 1 and the dielectric layer 3.

According to one particular embodiment, the microsensor 100 may comprise several field-effect transistors 5, in particular, for increasing the effectiveness of processing the electrical signal expressing the detection of ions. These transistors 5 may share, for example, one and the same lower chemical gate (at the surface 3a of the dielectric layer 3) positioned on one and the same cavity 2 in order to improve the sensitivity of the microsensor 100.

The microsensor 100 comprises at least one cavity 2 and a network of integrated channels 20, buried beneath an FET 5; the latter is configured to operate with an upper gate 53 and lower chemical gate (at the surface 3a of the dielectric layer 3) the electrochemical potential of which is influenced by the presence and the concentration of chemical species in the cavity 2. The presence of the cavity (cavities) 2 and network of channels 20 in the support substrate 1 of the structure 10 used for the production of the transistor 5, avoids the deep etching steps of the prior art for exposing the dielectric layer after the formation of the transistor. The joining of additional substrates or the carrying out of micromachining operations subsequent to the production of the transistor, to form reservoirs and channels for transporting the fluid to be analyzed, is no longer necessary owing to the structure 10 with buried cavity (cavities) 2 supporting the microsensor 100 of the present disclosure.

The microsensor 100 according to the present disclosure may be used for the detection of chemical species in ionic form in a gaseous or liquid fluid. By way of example, applications could be found in the field of gas detection or else of biological sensors for the detection of analytes in solution or the measurement of pH.

Of course, the present disclosure is not limited to the embodiments and examples described and embodiment variants may be introduced thereinto without departing from the scope of the invention as defined by the claims.

The invention claimed is:

1. A microsensor for detecting ions in a fluid, comprising:
a field-effect transistor having a source, a drain, an active region between the source and the drain, and a gate positioned above the active region;
an active layer in which the active region is formed;
a dielectric layer positioned beneath the active layer; and
a support substrate positioned beneath the dielectric layer and comprising at least one buried cavity, located plumb with the gate of the field-effect transistor to receive the fluid, the at least one buried cavity comprising a constriction in a vicinity of the dielectric layer and a flared portion in a deeper zone of the support substrate.

2. The microsensor of claim 1, wherein the at least one buried cavity is connected to a network of buried channels formed in the support substrate for transporting the fluid.

3. The microsensor of claim 2, wherein the active layer has a thickness between a few nanometers and a few hundred nanometers.

4. The microsensor of claim 3, wherein the dielectric layer has a thickness between a few ångströms and a few tens of nanometers.

5. The microsensor of claim 4, wherein the active layer is formed of at least one semiconductor material selected from silicon, silicon-germanium, germanium, and III-V compounds (arsenides, phosphides, and nitrides).

6. The microsensor of claim 5, wherein the dielectric layer comprises at least one insulating material selected from among silicon dioxide, silicon nitride, an oxynitride, hafnium oxide ($HfO_2$), alumina ($Al_2O_3$), tantalum oxide ($Ta_2O_5$) or a stack of layers of these materials.

7. The microsensor of claim 6, wherein the active layer comprises silicon and the field-effect transistor has a fully depleted silicon-on-insulator (FDSOI) architecture.

8. The microsensor of claim 7, wherein the at least one buried cavity has lateral dimensions of between around 100 nanometers and a few tens of microns and a depth of between a few tens of nanometers and a few hundred microns.

9. A process for fabricating a microsensor for detecting ions in a fluid, the process comprising:
providing a structure comprising an active layer positioned on a dielectric layer, the dielectric layer positioned on a support substrate, the structure comprising at least one buried cavity formed in the support substrate and positioned beneath the dielectric layer;
joining a first face of the support substrate to a first face of a donor substrate comprising the dielectric layer; and
producing a field-effect transistor having a source, a drain, an active region formed in the active layer and extending between the source and the drain, and a gate positioned above the active region, plumb with the at least one buried cavity.

10. The fabrication process of claim 9, wherein providing the structure further comprises:
forming, on the first face of the support substrate, the at least one buried cavity by etching; and
thinning the donor substrate so as to form the active layer.

11. The fabrication process of claim 10, wherein thinning the donor substrate comprises:
prior to joining, implanting light species in the donor substrate at the first face thereof to form a fragile buried layer; and
after joining, separating the donor substrate at the fragile buried layer to form the structure comprising the active layer positioned on the dielectric layer, the dielectric layer positioned on the support substrate, and a residual donor substrate.

12. The microsensor of claim 1, wherein the active layer has a thickness between a few nanometers and a few hundred nanometers.

13. The microsensor of claim 1, wherein the dielectric layer has a thickness between a few ångströms and a few tens of nanometers.

14. The microsensor of claim 1, wherein the active layer is formed of at least one semiconductor material selected from silicon, silicon-germanium, germanium, and III-V compounds (arsenides, phosphides, and nitrides).

15. The microsensor of claim 1, wherein the dielectric layer comprises at least one insulating material selected from among silicon dioxide, silicon nitride, an oxynitride, hafnium oxide ($HfO_2$), alumina ($Al_2O_3$), tantalum oxide ($Ta_2O_5$) or a stack of layers of these materials.

16. The microsensor of claim 1, wherein the active layer comprises silicon and the field-effect transistor has an FDSOI architecture.

17. The microsensor of claim 1, wherein the at least one buried cavity has lateral dimensions of between around 100 nanometers and a few tens of microns and a depth of between a few tens of nanometers and a few hundred microns.

* * * * *